US010225230B2

(12) United States Patent
Daugherty et al.

(10) Patent No.: US 10,225,230 B2
(45) Date of Patent: Mar. 5, 2019

(54) SYSTEM AND METHOD FOR ADDRESS-MAPPED CONTROL OF FIELD PROGRAMMABLE GATE ARRAY (FPGA) VIA ETHERNET

(71) Applicant: Raytheon Company, Waltham, MA (US)

(72) Inventors: Brandon H. Daugherty, Melissa, TX (US); Jason B. Emery, Dallas, TX (US); Brian D. Sirois, Northlake, TX (US); Bradley D. Staal, Allen, TX (US); Paul J. Lewis, Allen, TX (US); Michael S. Mitchener, Worcester, MA (US)

(73) Assignee: Raytheon Company, Waltham, MA (US)

( * ) Notice: Subject to any disclaimer, the term of this patent is extended or adjusted under 35 U.S.C. 154(b) by 160 days.

(21) Appl. No.: 15/379,065

(22) Filed: Dec. 14, 2016

(65) Prior Publication Data
US 2018/0234383 A1 Aug. 16, 2018

(51) Int. Cl.
*H03K 19/177* (2006.01)
*H04L 29/06* (2006.01)
(Continued)

(52) U.S. Cl.
CPC ............ *H04L 61/10* (2013.01); *G06F 13/385* (2013.01); *G06F 17/5054* (2013.01);
(Continued)

(58) Field of Classification Search
CPC ....... H04L 61/10; H04L 12/56; H04L 69/161; H04L 69/164; G06F 13/385;
(Continued)

(56) References Cited

U.S. PATENT DOCUMENTS 5,131,092 A * 7/1992 Sackmann ........... G05B 19/056
700/18
5,159,673 A * 10/1992 Sackmann ........... G05B 19/052
709/206

(Continued)

FOREIGN PATENT DOCUMENTS

WO 91/14988 A1 10/1991

OTHER PUBLICATIONS

Nikolaos Alachiotis, et al., "A Versatile UDP/IP based PC—FPGA Communication Platform," DOI: 10.1109/ReConFig.2012.6416725, 2012, 6 pages, publisher IEEE, available at http://sco.h-its.org/exelixis/pubs/Exelixis-RRDR-2012-10.pdf.

(Continued)

*Primary Examiner* — Daniel D Chang

(57) ABSTRACT

A method includes receiving, at a field programmable gate array (FPGA), one or more Ethernet packets of a message including control or status information associated with the FPGA. The method also includes determining, by the FPGA, a payload of each packet by removing at least one Ethernet header from the packet. The method further includes removing, by the FPGA, a User Datagram Protocol (UDP) header from each packet and determining UDP header metadata. The method also includes converting, by the FPGA based on the UDP header metadata, the packets to a read or write message associated with one or more registers of the FPGA. In addition, the method includes performing, by the FPGA, a read or write of the one or more registers of the FPGA according to the read or write message.

20 Claims, 7 Drawing Sheets

(51) Int. Cl.
*H04L 29/12* (2006.01)
*H04L 12/931* (2013.01)
*H04L 29/08* (2006.01)
*G06F 13/38* (2006.01)
*G06F 17/50* (2006.01)
*H03K 19/173* (2006.01)
*H04L 12/54* (2013.01)

(52) U.S. Cl.
CPC ... *H03K 19/1733* (2013.01); *H03K 19/17708* (2013.01); *H03K 19/17748* (2013.01); *H04L 12/56* (2013.01); *H04L 49/358* (2013.01); *H04L 67/06* (2013.01); *H04L 69/161* (2013.01); *H04L 69/164* (2013.01)

(58) Field of Classification Search
CPC ............ G06F 17/5054; H03K 19/1733; H03K 19/17708; H03K 19/17748
USPC .......................................................... 326/41
See application file for complete search history.

(56) References Cited

U.S. PATENT DOCUMENTS

| | | | |
|---|---|---|---|
| 8,224,638 B1* | 7/2012 | Shirazi | ................ G06F 17/5027 703/16 |
| 8,234,483 B2 | 7/2012 | Sharma | |
| 2012/0106560 A1* | 5/2012 | Gumaste | ................. H04L 45/04 370/401 |
| 2013/0343379 A1 | 12/2013 | Stroud et al. | |
| 2015/0081726 A1* | 3/2015 | Izenberg | ............. H04L 47/2433 707/755 |

OTHER PUBLICATIONS

Altera, "Qsys—System Integration Tool," 6 pages, downloaded Mar. 11, 2017, available at https://www.altera.com/products/design-software/fpga-design/quartus-prime/features/qts-qsys.html.

International Search Report and Written Opinion of the International Searching Authority in connection with International Patent Application No. PCT/US2017/049317 dated Apr. 23, 2018, 21 pages.

Hausknecht et al., "Efficient Firmware Implementation of a Multi-channel Scanning Receiver for Surveillance Applications", 9th International Multi-Conference on Systems, Signals and Devices, Mar. 2012, 6 pages.

Weerasinghe et al., "Disaggregated FPGAs: Network Performance Comparison Against Bare-Metal Servers, Virtual Machines and Linux Containers", 2016 IEEE 8th International Conference on Cloud Computing Technology and Science, Dec. 2016, 10 pages.

* cited by examiner

200 \ FIG. 2A

| | A | B | C | D |
|---|---|---|---|---|
| 1 | Message Type | Memory Map | | Classification: |
| 2 | FPGA Image Name(s) (comma separated) | mb1, mb2, asic12_test | 216 | Stakeholders |
| 3 | Module Name | global_status | | Stakeholder Approved |
| 4 | Code-Gen Name | global_status | | Software Process Sheet |
| 5 | Module Description | General tab for status bits, ID, and communication testing. | | |
| 6 | Base Module Memory Address | 0x00000000  206 | 204 | Start: |
| 7 | Base Address Mask | 0xFFFFF000 | | Size: |
| 8 | End Address | 0x00000FFF | Calculated | End: |
| 9 | Author | H Daugherty | Firmware | |
| 10 | Calculated | | Firmware | |
| 11 | Offset from base address (hex) | Register Name 212 | Data Element Name | Description 214 |
| 12 | 210  0 | Scratch Reg | | Software spare 32 bit reg for testing. |
| 13 | 4 | IDD revision | | SVN Revision |
| 14 | 8 | Image Type | | Uniquely identifies FPGA image |
| 15 | C | Image Version | Minor | The Minor build version Number |
| 16 | C | Image Version | Major | The Major build version Number |
| 17 | 10 | Image Date | | yyyymmdd - 4bits/char |
| 18 | 14 | num status regs | | Number of status register groups available |
| 19 | 18 | Interrupt IP Addr | | IP address to send an interrupt message to |
| 20 | 1C | Interrupt MAC Addr OUI | third_byte | Single byte of MAC Address to send an interrupt message to |
| 21 | 1C | Interrupt MAC Addr OUI | second_byte | Single byte of MAC Address to send an interrupt message to |
| 22 | 1C | Interrupt MAC Addr OUI | first_byte | Single byte of MAC Address to send an interrupt message to |
| 23 | 20 | Interrupt MAC Addr Device ID | sixth_byte | Single byte of MAC Address to send an interrupt message to |
| | 20 | Interrupt MAC Addr | fifth_byte | Single byte of MAC Address to |

MB1 Beam State Definition | MB2 Beam State Definition

READY — 202

| | E | F | G | H | I | J | K | |
|---|---|---|---|---|---|---|---|---|
| | Unclassified | | | | | | | |
| | H. Daugherty | | | | | | | |
| | | | | | | | | |
| | yes | | | | | | | |
| | no | | | | | | | |
| | | | | | | | | |
| | | | | | | | | |
| | 0x00000000 | | | 208 | | | | |
| | 0x00001000 | | | | | | | |
| | 0x00000FFF | | | | | | | |
| | Software | | | Firmware | | | Software | |
| FROM FIG. 2A | Type | Units | Resolution | Repeat Count | MSB | LSB | Range | TO FIG. 2C |
| | unsigned.int | | | | 31 | 0 | [0, 4294967295] | |
| | unsigned.int | | | | 31 | 0 | [0, 4294967295] | |
| | unsigned.int | | | | 31 | 0 | [0, 4294967295] | |
| | unsigned.int | | | | 15 | 0 | [0, 65535] | |
| | unsigned.int | | | | 31 | 16 | [0, 65535] | |
| | unsigned.int | | | | 31 | 0 | [0, 4294967295] | |
| | unsigned.int | | | | 5 | 0 | [0, 63] | |
| | unsigned.int | | | | 31 | 0 | [0, 4294967295] | |
| | unsigned.int | | | | 7 | 0 | [0, 255] | |
| | unsigned.int | | | | 15 | 8 | [0, 255] | |
| | unsigned.int | | | | 23 | 16 | [0, 255] | |
| | unsigned.int | | | | 7 | 0 | [0, 255] | |
| | unsigned.int | | | | 15 | 8 | [0, 255] | |

| MB1 - Error Signals | MB2 - Error Signals | ASIC12 Test - Error Signals |

FIG. 2C

| | L | M | N | O | P | Q |
|---|---|---|---|---|---|---|
| | | | | | | |
| | | | | | | |
| | | | | | | |
| | | | | | | |
| | | | | | | |
| | | | | | | |
| | | | | | | |
| | | | | | | |
| | | | Firmware | | Software | |
| | Reset | Read/Write | Address Increment (# bytes) | Instantiate Register | SW Generated Register | SW Initialization |
| | 0x12345678 | RW | 4 | Y | X | X |
| | 0x0000003F | R | 4 | Y | X | X |
| | 0 | R | 4 | Y | X | X |
| | 0x4321 | R | 0 | Y | X | X |
| | 0x8765 | R | 4 | Y | X | X |
| | | R | 4 | Y | X | X |
| | 0x30 | R | 4 | Y | X | X |
| | 0x0A040102 | RW | 4 | Y | X | X |
| | 0x99 | RW | 0 | Y | X | X |
| | 0x85 | RW | 0 | Y | X | X |
| | 0x68 | RW | 4 | Y | X | X |
| | 0xE6 | RW | 0 | Y | X | X |
| | 0x3E | RW | 0 | Y | X | X |

FROM FIG. 2B global_status  a ...  ⊕       85%

SYSTEM AND METHOD FOR ADDRESS-MAPPED CONTROL OF FIELD PROGRAMMABLE GATE ARRAY (FPGA) VIA ETHERNET

GOVERNMENT RIGHTS

This invention was made with U.S. government support under contract number N00019-13-C-0128 awarded by the U.S. Navy. The U.S. government may have certain rights in this invention.

TECHNICAL FIELD

This disclosure is directed in general to circuit card assemblies. More specifically, this disclosure relates to a system and method for address-mapped control of a field programmable gate array (FPGA) via Ethernet.

BACKGROUND

Field programmable gate array (FPGAs) are widely used in a broad variety of industries and technologies, including medical equipment, automobiles, telecommunication devices, defense and military applications, and many other technologies. Ethernet is a standard prevalent interface for digital circuit card assemblies (CCAs) and can be easily implemented in FPGAs or processors, allowing software control of hardware functions over a network. Processors can implement Ethernet with a software "stack" that allows flexible and full functionality, but this often comes with a significant performance penalty, such as in reduced throughput or increased latency.

SUMMARY

This disclosure provides a system and method for address-mapped control of a field programmable gate array (FPGA) via Ethernet.

In a first embodiment, a method includes receiving, at a field programmable gate array (FPGA), one or more Ethernet packets of a message including control or status information associated with the FPGA. The method also includes determining, by the FPGA, a payload of each packet by removing at least one Ethernet header from the packet. The method further includes removing, by the FPGA, a User Datagram Protocol (UDP) header from each packet and determining UDP header metadata. The method also includes converting, by the FPGA based on the UDP header metadata, the packets to a read or write message associated with one or more registers of the FPGA. In addition, the method includes performing, by the FPGA, a read or write of the one or more registers of the FPGA according to the read or write message.

In a second embodiment, an FPGA includes an Ethernet interface configured to receive one or more Ethernet packets of a message including control or status information associated with the FPGA. The FPGA also includes a plurality of registers. The FPGA further includes firmware. The firmware is configured to cause the FPGA to determine a payload of each packet by removing at least one Ethernet header from the packet. The firmware is also configured to cause the FPGA to remove a UDP header from each packet and determine UDP header metadata. The firmware is further configured to cause the FPGA to convert, based on the UDP header metadata, the packets to a read or write message associated with one or more of the registers. In addition, the firmware is configured to cause the FPGA to perform a read or write of the one or more registers according to the read or write message.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIG. 2A through 2C illustrates an example display of an interface design description (IDD) according to this disclosure;

DETAILED DESCRIPTION

Figure 1:
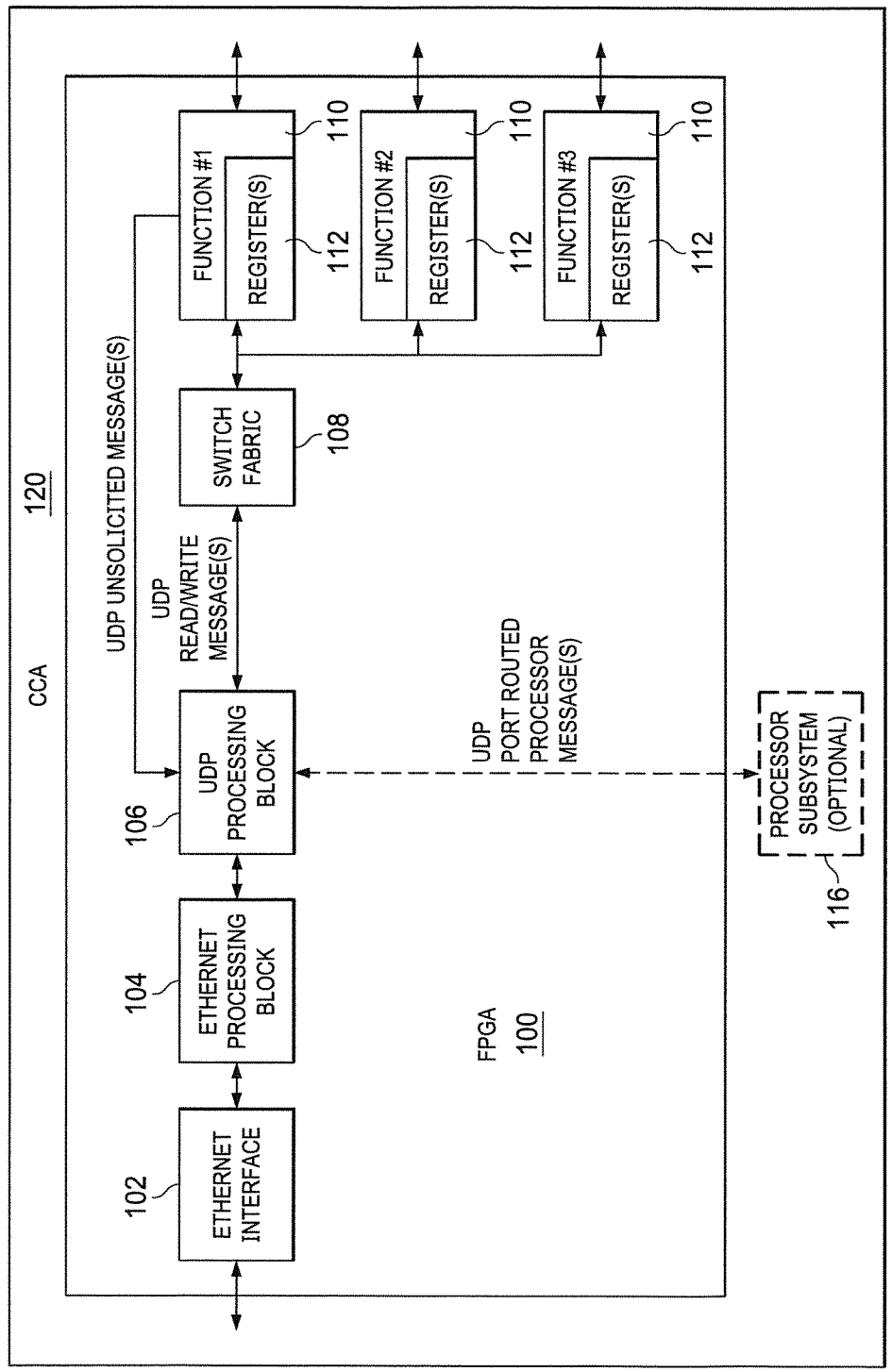
FIG. 1 illustrates an example field programmable gate array (FPGA) supporting address-mapped control via Ethernet according to this disclosure.

FIGS. 1 through 7, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and not meant to imply that the feature or component cannot be employed in the embodiment(s) described in connection with that figure.

As discussed above, field programmable gate arrays (FPGAs) may be used in many applications, including both military and non-military applications. For example, FPGAs may be used in radar applications, such as for military devices or vehicles. In particular, there may be multiple FPGAs in a radar device, such as one or more FPGAs in an antenna portion, one or more FPGAs in a receiver/exciter portion, and one or more FPGAs in a signal processing portion. In the signal processing portion, one or more FPGAs may receive a digitized signal; process the signal using one or more mathematical routines, filtering blocks, and the like; and output the processed signal to another portion of the radar. Thus, operation of the FPGAs can depend on the ability to read and write information and data with other components external to the FPGAs.

Ethernet is a standard prevalent protocol for connecting to digital hardware. Ethernet interfaces can be easily implemented in FPGAs or general purpose processors (e.g., a CPU for executing software instructions), allowing software control of hardware functions over a network. Processors can implement Ethernet with a software "stack," which allows flexible and full functionality. However, such software stacks are often associated with significant performance issues, such as decreased throughput or increased latency. A low-latency, high-throughput FPGA system providing the flexibility to write and read a large variety of control and status information, without the intervention of a processor, is advantageous in electronic warfare, radar, communication, or other applications where real-time control is critical.

To address these or other issues, embodiments of this disclosure provide a flexible address-mapped control/status structure for an FPGA. Ethernet is used as the interface to the FPGA to carry read/write messaging from software or other components. An electronic user interface, referred to as an interface design description (IDD), is used to describe the address space for the FPGA. Software tools take the information in the IDD and create firmware and software files that can be incorporated into one or more target designs. These files handle the overhead of recreating FPGA registers and memories defined by the IDD and enumerate an address mapping to automatically keep the firmware and software interfaces aligned.

The disclosed embodiments provide a number of technical advantages. For example, using the disclosed embodiments, it is fast and easy to reuse existing FPGA infrastructure and apply it to a new FPGA design, as well as to modify a register memory map and regenerate code following the modification(s). This results in lower development or implementation costs. Also, the disclosed embodiments enforce interface consistency between firmware and software by minimizing custom message types and providing comprehensive documentation for FPGAs.

It will be understood that embodiments of this disclosure may include any one, more than one, or all of the features described here. Also, embodiments of this disclosure may additionally or alternatively include other features not listed here. While the disclosed embodiments are described with respect to FPGAs in communication, radar, and electronic warfare applications, these embodiments are also applicable in any other suitable systems or applications.

FIG. 1 illustrates an example field programmable gate array (FPGA) 100 supporting address-mapped control via Ethernet according to this disclosure. As shown in FIG. 1, the FPGA 100 includes an Ethernet interface 102, an Ethernet processing block 104, a User Datagram Protocol (UDP) processing block 106, a switch fabric 108, and one or more FPGA functions 110. In some embodiments, the FPGA 100 is part of a circuit card assembly (CCA) 120. Each FPGA function 110 is controlled by one or more FPGA registers 112. In different embodiments, the components 102-112 are incorporated in firmware, hardware, or a combination of the two within the FPGA 100. One or more of the components 102-112 may be generated using a Register Transfer Level (RTL) language or another hardware or firmware programming language. In some embodiments, the FPGA 100 can use the FPGA registers 112 for control of other hardware components installed on the CCA 120. CCA hardware control operations are defined in part by reading from or writing to one or more of the registers 112. The FPGA 100 facilitates Ethernet UDP frame processing in the FPGA 100 without processor intervention. In particular, the FPGA 100 uses the Ethernet and UDP protocols to read and write control and status information messages between the registers 112 and components external to the FPGA 100.

The Ethernet interface 102 provides an industry standard control interface between the FPGA 100 and components external to the FPGA 100, such as a software processor or another FPGA. An FPGA 100 typically uses a control interface as a way for an external component to communicate with the FPGA 100 and instruct the FPGA 100 how to operate through control messaging. The FPGA 100 leverages Ethernet as the control interface implemented inside the FPGA 100. Ethernet is an advantageous protocol because it is common, widely supported, easily implemented in FPGAs and processors, and easy to interface to a computer (e.g., a personal computer or PC). This makes testing easier and more convenient. The Ethernet interface 102 provides such an industry standard interface and could require a minimal number of message types. Ethernet packets are written to or read from the FPGA 100 through the Ethernet interface 102. In some embodiments, the Ethernet interface 102 is provided by the FPGA hardware directly without the need for additional firmware development and operates at a standard Media Access Control (MAC) layer, Physical Medium Attachment (PMA) layer, or Physical Coding Sublayer (PCS) layer. The Ethernet interface 102 could be vendor-specific and can vary depending on which vendor produces the FPGA 100.

The Ethernet processing block 104 receives Ethernet packets from and sends Ethernet packets to the Ethernet interface 102. Among other things, the Ethernet processing block 104 can support and respond to various Ethernet protocols including, but not limited to, Internet Command Messaging Protocol (ICMP), Address Resolution Protocol (ARP), and User Datagram Protocol (UDP) messaging for reading and writing messages. When the Ethernet processing block 104 receives Ethernet packets from the Ethernet interface 102, the Ethernet processing block 104 removes the Ethernet header and determines the protocol used in the received packet. If a UDP packet is received, the Ethernet processing block 104 parses and removes the UDP header and forwards the UDP payload and UDP header metadata to the UDP processing block 106. If an ICMP or ARP Ethernet packet is received, the Ethernet processing block 104 parses the received packet, constructs a response, and transmits the response to the Ethernet interface 102. Conversely, when the Ethernet processing block 104 receives UDP payload data and UDP header metadata from the UDP processing block 106 to be sent to an external component through the Ethernet interface 102, the Ethernet processing block 104 constructs the UDP and Ethernet headers and appends the UDP payload to the packet. The resulting packet is transmitted to the Ethernet interface 102 which transmits the packet out of the FPGA 100.

The UDP processing block 106 converts UDP header metadata and payload information into FPGA register read/write messages. While Ethernet includes multiple protocols that can be used for messaging, the FPGA 100 uses UDP because UDP has relatively low latency, as it is a connectionless protocol requiring no communication setup prior to transmission (which is good for real-time applications such as communications, radar, and electronic warfare jamming applications). In addition, UDP has a high payload to packet size ratio, resulting in high throughput (on the order of gigabits/sec), thus capable of supporting real-time control. In addition, the UDP protocol includes a minimal number of custom message types that are required for control, simplifying receive processing. The UDP processing block 106 could be implemented using only firmware within the FPGA 100.

The UDP processing block 106 uses a UDP frame format for payload data, which allows Ethernet packets to read and write any address within the FPGA 100. The UDP processing block 106 receives UDP header metadata and payload data from the Ethernet processing block 104. The UDP processing block 106 examines the payload, and then routes the payload to either the switch fabric 108 or the optional processor subsystem 116 based on the UDP header metadata to allow the FPGA 100 to perform the actual read or write. For example, the UDP processing block 106 interprets the payload and determines whether the payload represents a read message or a write message. A master interface in the UDP processing block 106 communicates with the switch fabric 108 and instructs the switch fabric 108 to perform the actual read or write. For all packets routed to the switch fabric 108, the UDP processing block 106 removes an additional custom header from the payload that contains switch fabric control information (address, command type, and length). The UDP processing block 106 uses this additional information to command the switch fabric 108 through a master port to execute reads or writes to the registers 112 connected to the switch fabric 108 slave ports. Acknowledgment of the transaction, as well as read data (if any), is transmitted from the UDP processing block 106 back through the Ethernet processing block 104 and Ethernet interface 102.

The switch fabric 108 operates to provide access to the FPGA functions 110 within the FPGA 100. In some embodiments, the switch fabric 108 utilizes an industry standard AXI switch fabric, although other switch fabrics can be used. Each FPGA function 110 is controlled by one or more of the FPGA registers 112. For example, control and status information can be mapped to various ones of the registers 112. FPGA operations are defined in part by reading from or writing to a register 112. In some embodiments, the switch fabric 108 can have a one-master/multiple-slave architecture. The master side receives a request to write to a register 112 or read from a register 112, and the master determines which of the registers 112 or addresses is/are applicable. The switch fabric 108 and registers 112 can be generated using an IDD code generation tool that is described in greater detail below.

As shown in FIG. 1, no software processor is required for operation of the FPGA 100. Processing is handled within the FPGA 100. However, the UDP processing block 106 can be configured to allow messages to and from an optional software co-processor 116 or other external processing device or system. The software co-processor 116 need not control the FPGA 100 or the components 102-112 in the Ethernet path. The software co-processor 116 could simply be a connected device that can share information with the FPGA 100. For example, the UDP processing block 106 can include firmware and logic to support one or more UDP destination ports for routing messages to and from the software co-processor 116. In particular, the UDP processing block 106 can receive or generate unsolicited messages based on an event that happens inside the firmware, such as periodic inertial data and interrupt based fault reporting (such as fault conditions or fault bits) recorded in the registers 112. Such unsolicited messages can be packetized by the UDP processing block 106 and transmitted to the software co-processor 116. Thus, the software co-processor 116 does not have to continuously poll the FPGA 100 for status information.

From the above description, it can be seen that address-mapped control/status of the FPGA 100 can be directly accessed by simple Ethernet UDP frames. This reduces the number of needed message types while maintaining flexibility. Such an FPGA-based implementation can provide low latency, high throughput, and real-time control. This is in contrast to software processor-based implementations, which can have significant performance limitations. The FPGA 100 allows for easily customizable control of millions of control/status addresses, including external memory, with minimal Ethernet packet types.

Although FIG. 1 illustrates one example of an FPGA 100 supporting address-mapped control via Ethernet, various changes may be made to FIG. 1. For example, while the Ethernet processing block 104 and the UDP processing block 106 are shown as separate components, this is merely for clarity of illustration. In some embodiments, these components could be combined into one functional unit. In general, the makeup and arrangement of the FPGA 100 are for illustration only. Components could be added, omitted, combined, or placed in any other configuration according to particular needs.

FIGS. 2A through 2C illustrate an example display of an interface design description (IDD) 200 according to this disclosure. In some embodiments, the IDD 200 can be used in the generation of firmware and software files that can be incorporated into the FPGA 100 of FIG. 1. In particular, the IDD 200 can be used in the generation or configuration of the switch fabric 108 and the registers 112 of FIG. 1. The IDD 200 could be analogous to a memory map or data sheet for configuration of the firmware of the FPGA 100. Use of the IDD 200 significantly reduces overhead in creating and maintaining control infrastructure of the firmware. The IDD 200 can be used to map some or all of the FPGA registers 112 to various operations. Execution of a firmware generation tool (described below with respect to FIG. 3) may create the registers 112 that can be read and written to.

As shown in FIGS. 2A through 2C, the IDD 200 is embodied in a user interface, such as a web UI or a spreadsheet application. The IDD 200 includes multiple tabs 202. Each tab 202 is associated with one or more FPGA functions 110 and includes multiple data fields. As described above, each function 110 is controlled by one or more registers 112. The registers 112 are defined by the information in the data fields associated with each tab 202. These data fields or additional data fields can be used for configuration of the switch fabric 108. While the use of tabs 202 is shown in FIGS. 2A through 2C, this is merely one example; the functions 110 could be organized and delineated in other ways within the scope of this disclosure, such as by using separate .csv or .txt files for each function 110.

A range of addresses is allocated for each function 110. For example, in FIGS. 2A through 2C, the range is from a beginning address 204 ("0x0000000") to an end address 206 ("0x00000FFF"). The beginning address 204 represents the lowest switch fabric address allocated to the function 110. The end address 206 represents the largest switch fabric address allocated to the function 110. The addresses 204-206 define unique and non-overlapping ranges for each function 110. The registers 112 of the function 110 are listed in the IDD 200 in a table 208. For each register 112, the table 208 identifies an address offset 210, a name 212, a description 214, and various other fields of information.

Depending on the embodiment, each tab 202 of the IDD 200 can be associated with one FPGA or multiple FPGAs, where each FPGA is identified by a name 216. The names 216 indicate which FPGAs are associated with the configuration information in the current tab 202 of the IDD 200. For example, FIGS. 2A through 2C, the current tab 202 provides configuration information for FPGAs 'mb1', 'mb2', and 'asic12_test'. In this way, the IDD 200 supports concurrent configuration of multiple FPGAs.

The IDD 200 provides a convenient user interface for easy addition, subtraction, modification, and customization of control and status information for the FPGA 100, as well as associated design code. The information in the IDD 200 is used to generate enumerated types and constants for register error and status mapping, which are easy to instantiate in RTL or other code. This reduces code volatility, increases code readability, and eliminates manual address and bit mapping. The IDD allows for fast prototyping of new designs with a fully functional control interface.

Although FIGS. 2A through 2C illustrate one example of a display of an IDD 200, various changes may be made to FIGS. 2A through 2C. For example, the makeup and arrangement of the information of the IDD 200 are for illustration only. In general, computer applications and user interfaces are highly configurable, and components could be added, omitted, combined, or placed in any other configuration according to particular needs.

Figure 3:
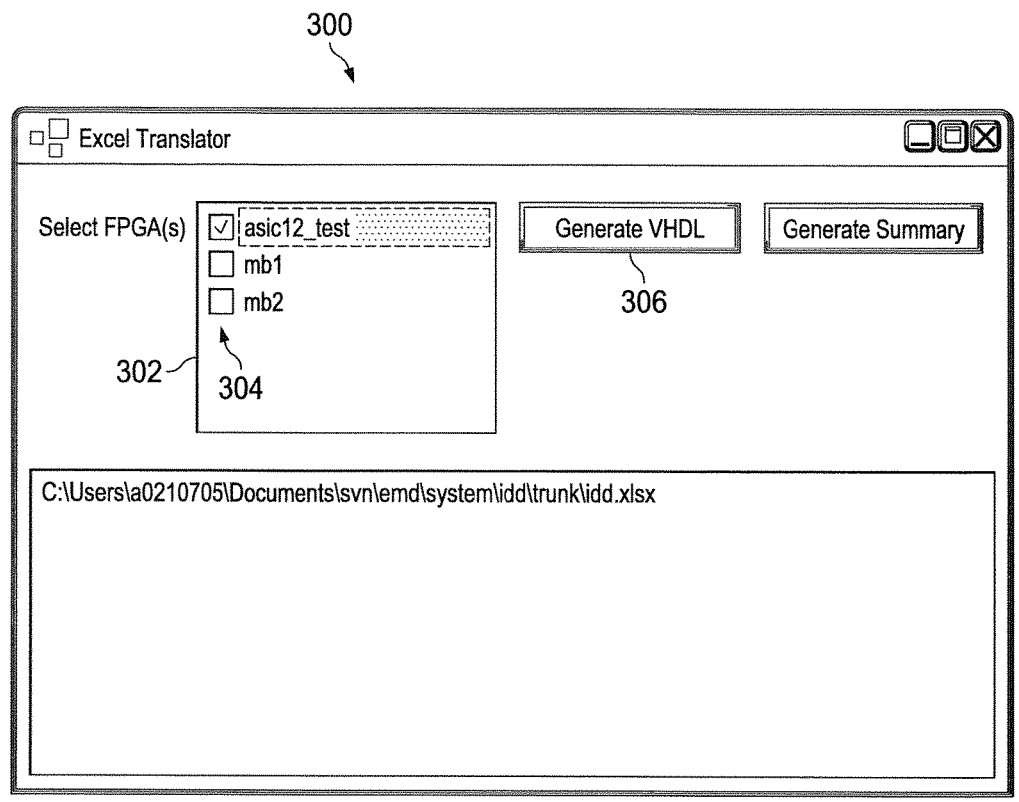
FIG. 3 illustrates an example display of a firmware generation tool according to this disclosure.

FIG. 3 illustrates an example display 300 of a firmware generation tool according to this disclosure. In some embodiments, the firmware generation tool can be used to generate firmware based on information in the IDD 200 of FIGS. 2A through 2C, and the firmware can be used in the FPGA 100 of FIG. 1. In particular embodiments, the firmware generation tool denotes a software application that executes on a computing device, and the firmware generation tool uses the information collected in the IDD 200 to generate the AXI-based switch fabric 108 and the register structure for the registers 112 in the FPGA 100. Once a user configures the control and status information for the FPGA 100 using the IDD 200, the user can open the firmware generation tool for operation.

As shown in FIG. 3, the display 300 presents a list 302 of FPGAs for which firmware can be generated. The FPGAs in the list 302 can be determined by creating a union of the FPGA names 216 listed in the tabs 202 in the IDD 200. Once the list 302 is presented in the display 300, a user can select one or more FPGAs for which the user wants to generate code. For example, the user can select one or more FPGAs by clicking a checkbox 304 for each FPGA, highlighting an FPGA in a drop-down list, or performing any other suitable selection operation. Once one or more FPGAs are selected, the user selects a button 306 (or actuates any other suitable control) to generate the firmware code for the selected FPGA(s). Code is generated for each FPGA function 110 according to which corresponding tab(s) 202 in the IDD 200 are associated with the selected FPGA(s). For instance, if a user selects the FPGA named 'asic12_test', the firmware generation tool determines which tabs 202 in the IDD 200 have 'asic12_test' listed and generates code for each FPGA function 110 that corresponds to the tab(s) 202.

Figure 4:
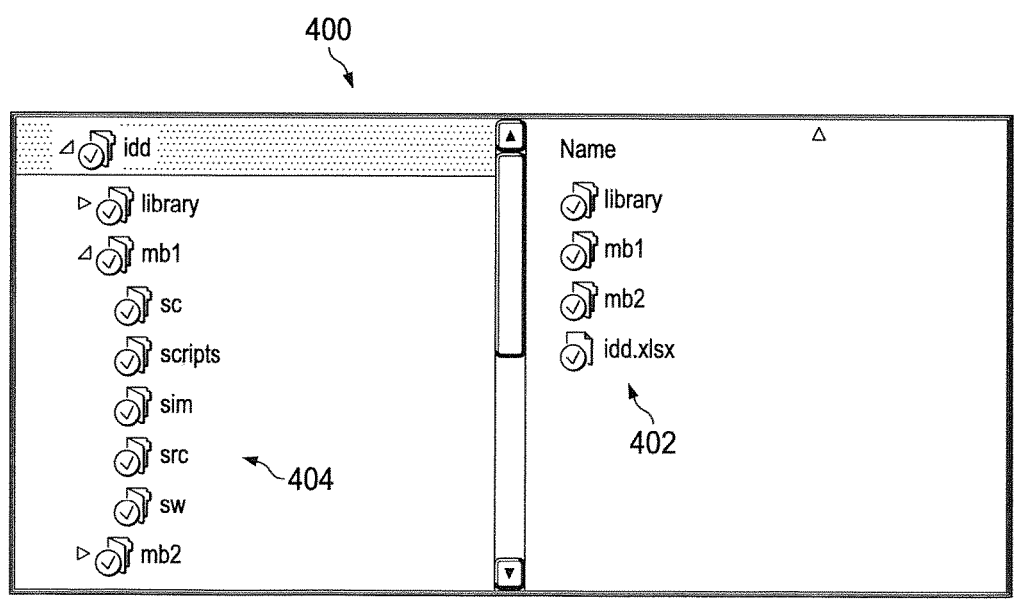
FIG. 4 illustrates an example of a file folder tree structure for firmware code files according to this disclosure.

In some embodiments, the code generated by the firmware generation tool is VHDL code, although other RTL or firmware languages may be used and are within the scope of this disclosure. The generated code can be arranged as a group of one or more text files that are readable in a MICROSOFT WINDOWS environment or another suitable operating system and may be organized in a file folder tree structure, such as shown in FIG. 4 described below. Also, in some embodiments, the firmware generation tool may be used to generate constants and data structures that map human-readable strings to FPGA addresses suitable for use in software development.

Although FIG. 3 illustrates one example of a display 300 of a firmware generation tool, various changes may be made to FIG. 3. For example, the makeup and arrangement of the information in the display 300 are for illustration only. In general, computer applications and user interfaces are highly configurable, and components could be added, omitted, combined, or placed in any other configuration according to particular needs.

FIG. 4 illustrates an example of a file folder tree structure 400 for firmware code files according to this disclosure. As shown in FIG. 4, the file folder tree structure 400 includes at least one IDD file 402 and a plurality of file folders 404. The IDD file 402 represents a spreadsheet file that includes information contained in an IDD, such as the IDD 200. The file folders 404 represent folders into which firmware code can be stored and organized.

Although FIG. 4 illustrates one example of a file folder tree structure for firmware code files, various changes may be made to FIG. 4. For example, the makeup and arrangement of the information in the file folder tree structure 400 are for illustration only. In general, file storage organizations and systems are highly configurable, and components could be added, omitted, combined, or placed in any other configuration according to particular needs.

Figure 5:
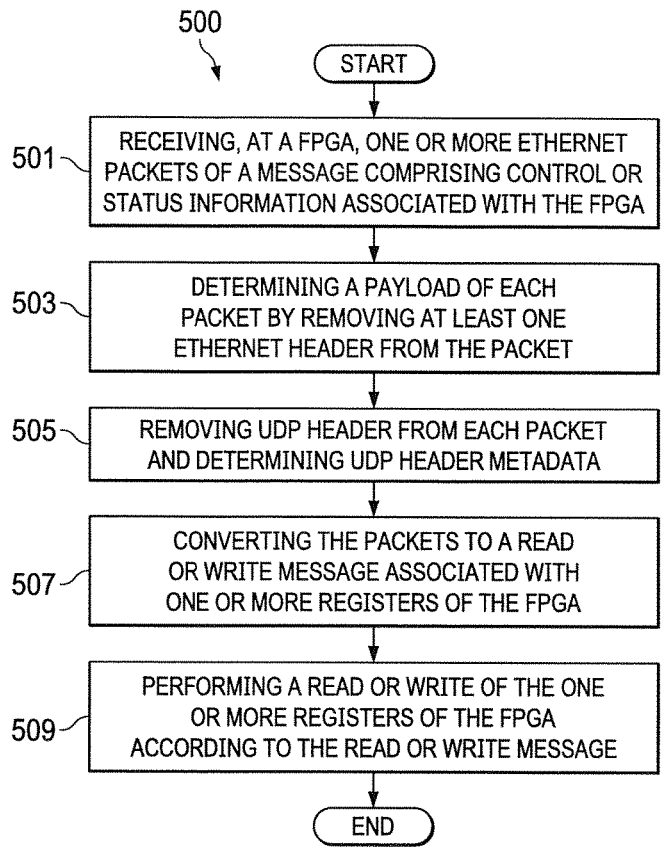
FIG. 5 illustrates an example method for address-mapped control of an FPGA via Ethernet according to this disclosure.

FIG. 5 illustrates an example method 500 for address-mapped control of an FPGA via Ethernet according to this disclosure. For ease of explanation, the method 500 is described as being performed using the FPGA 100 of FIG. 1. However, the method 500 could be used with any other suitable system.

At step 501, one or more Ethernet packets of a message are received at an FPGA 100. This may include, for example, the Ethernet interface 102 receiving Ethernet packets from a source external to the FPGA 100. In some embodiments, the Ethernet interface 102 operates at a MAC layer, PMA layer, or PCS layer. The message includes control or status information associated with the FPGA.

At step 503, a payload of each packet is determined by removing at least one Ethernet header from the packet. This may include, for example, the Ethernet processing block 104 removing Ethernet headers from the packets.

At step 505, a UDP header is removed from each packet and UDP header metadata is determined. This may include, for example, the Ethernet processing block 104 removing the UDP header from each packet and determining the UDP header metadata.

At step 507, the packets are converted to a read or write message associated with one or more registers 112 of the FPGA 100 and routed to a switch fabric 118 based on the UDP header metadata. This may include, for example, the UDP processing block 106 checking the packets for errors, converting the packets to read or write messages associated with one or more of the registers 112, and routing the read or write messages. In some embodiments, the registers 112 are determined or configured using the IDD 200 and the process and tools described with respect to FIGS. 2 through 4.

At step 509, a read or write of the registers 112 of the FPGA 100 is performed according to the read or write message constructed in step 507. This may include, for example, the switch fabric 108 performing the read or write of the registers 112.

Although FIG. 5 illustrates one example of a method 500 for address-mapped control of an FPGA 100 via Ethernet, various changes may be made to FIG. 5. For example, while shown as a series of steps, various steps shown in FIG. 5 could overlap, occur in parallel, occur in a different order, or occur multiple times. Moreover, some steps could be combined or removed and additional steps could be added according to particular needs. In addition, as noted above, protocols other than UDP could be supported by an FPGA 100.

Figure 6:
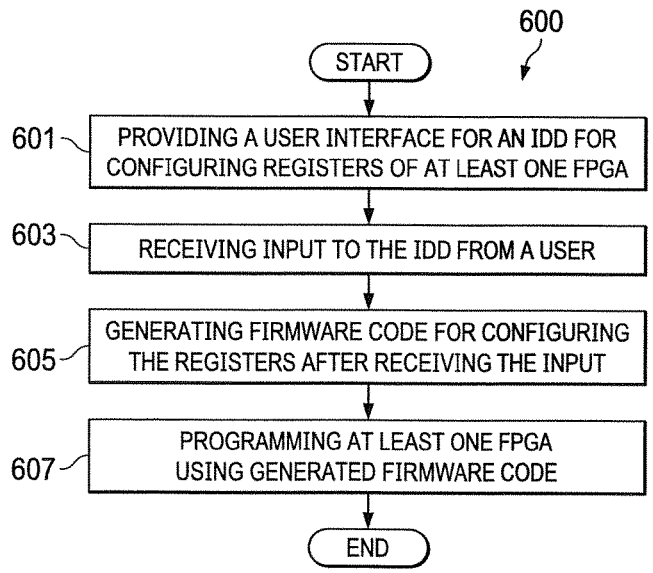
FIG. 6 illustrates an example method for configuration of an FPGA according to this disclosure.

FIG. 6 illustrates an example method 600 for configuration of an FPGA 100 according to this disclosure. For ease of explanation, the method 600 is described as being performed using the IDD 200 of FIGS. 2A through 2C and the firmware generation tool of FIG. 3. However, the method 600 could be used with any other suitable system.

At step 601, a user interface is provided for an IDD 200. This may include, for example, providing the IDD 200 in a user interface. The IDD 200 includes data fields for configuring registers of at least one FPGA 100, such as the FPGA 100 of FIG. 1.

At step 603, input to the IDD 200 is received from a user. This may include, for example, a user updating one or more fields of the IDD 200, such as the address fields 204-206, which relate to the beginning and ending addresses of the given function 110, or the name field 212, which lists a name for the function 110. The input includes configuration data associated with the registers 112.

At step 605, based on the input from the user, firmware code is generated for configuring the registers. This may include, for example, the firmware generation tool generating VHDL or other code for the registers 112.

At step 607, at least one FPGA 100 is programmed using the generated firmware code. This may include, for example, programming the FPGA 100, including the registers 112.

Although FIG. 6 illustrates one example of a method 600 for configuration of an FPGA 100, various changes may be made to FIG. 6. For example, while shown as a series of steps, various steps shown in FIG. 6 could overlap, occur in parallel, occur in a different order, or occur multiple times. Moreover, some steps could be combined or removed and additional steps could be added according to particular needs. device.

Figure 7:
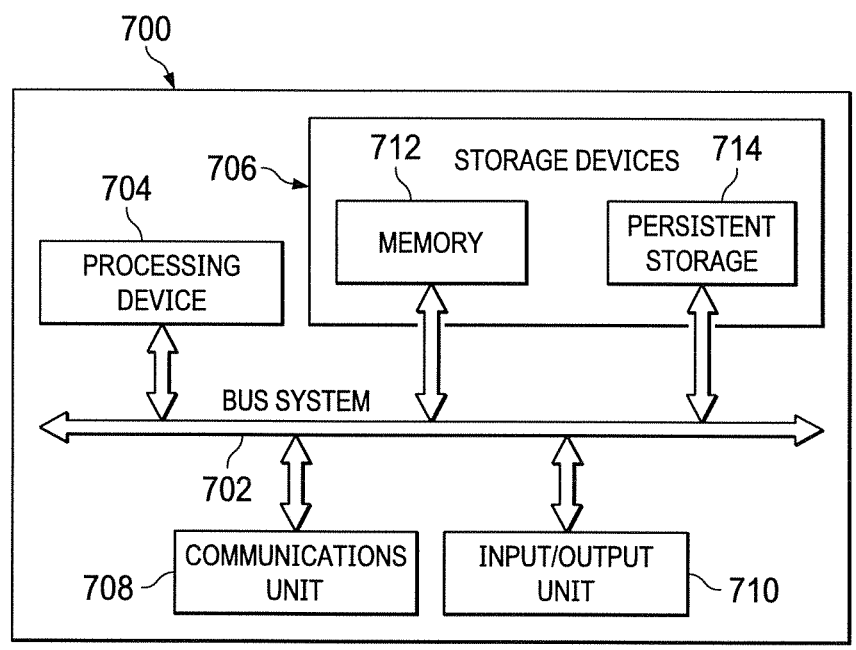
FIG. 7 illustrates an example device for performing various operations according to this disclosure.

FIG. 7 illustrates an example device 700 for performing various operations according to this disclosure. The device 700 could, for example, represent a computing device for implementing the IDD 200 of FIGS. 2A through 2C or the firmware generation tool of FIG. 3. The device 700 could represent any other suitable device.

As shown in FIG. 7, the device 700 can include a bus system 702, which supports communication between at least one processing device 704, at least one storage device 706, at least one communications unit 708, and at least one input/output (I/O) unit 710. The processing device 704 executes instructions that may be loaded into a memory 712. The processing device 704 may include any suitable number(s) and type(s) of processors or other devices in any suitable arrangement. Example types of processing devices 704 include microprocessors, microcontrollers, digital signal processors, field programmable gate arrays, application specific integrated circuits, and discrete circuitry.

The memory 712 and a persistent storage 714 are examples of storage devices 706, which represent any structure(s) capable of storing and facilitating retrieval of information (such as data, program code, and/or other suitable information on a temporary or permanent basis). The memory 712 may represent a random access memory or any other suitable volatile or non-volatile storage device(s). The persistent storage 714 may contain one or more components or devices supporting longer-term storage of data, such as a ready only memory, hard drive, Flash memory, or optical disc. In accordance with this disclosure, the memory 712 and the persistent storage 714 may be configured to store instructions associated with facilitating dynamic remapping of absolute addresses during a software migration.

The communications unit 708 supports communications with other systems, devices, or networks, such as the FPGA 100. For example, the communications unit 708 could include a network interface that facilitates communications over at least one Ethernet network to and from Ethernet interface 102 of FPGA 100. The communications unit 708 could also include a wireless transceiver facilitating communications over at least one wireless network. The communications unit 708 may support communications through any suitable physical or wireless communication link(s).

The I/O unit 710 allows for input and output of data. For example, the I/O unit 710 may provide a connection for user input through a keyboard, mouse, keypad, touchscreen, or other suitable input device. The I/O unit 710 may also send output to a display, printer, or other suitable output device.

Although FIG. 7 illustrates one example of a device 700 for performing various operations, various changes may be made to FIG. 7. For example, various components in FIG. 7 could be combined, further subdivided, or omitted and additional components could be added according to particular needs. Also, computing devices can come in a wide variety of configurations, and FIG. 7 does not limit this disclosure to any particular configuration of device.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   receiving, at a field programmable gate array (FPGA), one or more Ethernet packets of a message including control or status information associated with the FPGA;
   determining, by the FPGA, a payload of each packet by removing at least one Ethernet header from the packet;
   removing, by the FPGA, a User Datagram Protocol (UDP) header from each packet and determining UDP header metadata;
   converting, by the FPGA based on the UDP header metadata, the packets to a read or write message associated with one or more registers of the FPGA;
   performing, by the FPGA, a read or write of the one or more registers of the FPGA according to the read or write message;
   receiving an unsolicited message based on an event that has been recorded in at least one of the one or more registers; and
   sending the unsolicited message to a processor external to the FPGA.

2. The method of claim 1, wherein the read or write is performed using a switch fabric of the FPGA.

3. The method of claim 1, wherein the one or more Ethernet packets are received at an Ethernet interface of the FPGA, the Ethernet interface configured to operate at a Media Access Control (MAC) layer, a Physical Medium Attachment (PMA) layer, or a Physical Coding Sublayer (PCS) layer.

4. The method of claim 1, wherein the one or more registers are configured for control of a circuit card assembly (CCA).

5. The method of claim 4, wherein the FPGA is part of the CCA.

6. The method of claim 1, wherein the event is a fault condition.

7. The method of claim 1, further comprising:
   configuring the one or more registers using an interface design description (IDD) that includes a user interface.

8. The method of claim 7, further comprising:
   generating firmware code for configuring the one or more registers based on data stored in the IDD.

9. The method of claim 8, wherein the firmware code includes Register Transfer Level (RTL) code.

10. The method of claim 1, wherein the event is an event that occurs inside firmware of the FPGA.

11. A field programmable gate array (FPGA) comprising:
    an Ethernet interface configured to receive one or more Ethernet packets of a message including control or status information associated with the FPGA;
    a plurality of registers; and
    firmware configured to cause the FPGA to:
      determine a payload of each packet by removing at least one Ethernet header from the packet;
      remove a User Datagram Protocol (UDP) header from each packet and determine UDP header metadata;
      convert, based on the UDP header metadata, the packets to a read or write message associated with one or more of the registers;
      perform a read or write of the one or more registers according to the read or write message;
      receive an unsolicited message based on an event that has been recorded in at least one of the one or more registers; and
      send the unsolicited message to a processor external to the FPGA.

12. The FPGA of claim 11, wherein the firmware is configured to generate a switch fabric of the FPGA, the switch fabric configured to perform the read or write.

13. The FPGA of claim 11, wherein the Ethernet interface is configured to operate at a Media Access Control (MAC) layer, a Physical Medium Attachment (PMA) layer, or a Physical Coding Sublayer (PCS) layer.

14. The FPGA of claim 11, wherein the one or more registers are configured for control of a circuit card assembly (CCA).

15. The FPGA of claim 14, wherein the FPGA is part of the CCA.

16. The FPGA of claim 11, wherein the event is a fault condition.

17. The FPGA of claim 11, wherein the one or more registers of the FPGA are configured using an interface design description (IDD) that includes a user interface.

18. The FPGA of claim 17, wherein the one or more registers are configured using firmware code that is generated based on data stored in the IDD.

19. The FPGA of claim 18, wherein the firmware code includes Register Transfer Level (RTL) code.

20. The FPGA of claim 11, wherein the event is an event that occurs inside the firmware of the FPGA.

* * * * *